United States Patent
Lee et al.

(10) Patent No.: US 7,672,170 B2
(45) Date of Patent: Mar. 2, 2010

(54) FLASH MEMORY DEVICE AND PROGRAM METHOD THEREOF

(75) Inventors: Byeong-Hoon Lee, Seoul (KR);
Sun-Kwon Kim, Suwon-si (KR)

(73) Assignee: Samsung Electronics Co., Ltd,
Suwon-si, Gyeonggi-do (KR)

( * ) Notice: Subject to any disclaimer, the term of this patent is extended or adjusted under 35 U.S.C. 154(b) by 218 days.

(21) Appl. No.: 11/769,429

(22) Filed: Jun. 27, 2007

(65) Prior Publication Data
US 2008/0183951 A1 Jul. 31, 2008

(30) Foreign Application Priority Data
Jan. 25, 2007 (KR) .............. 10-2007-0008024

(51) Int. Cl.
*G11C 16/04* (2006.01)
(52) U.S. Cl. .............. 365/185.27; 365/185.18
(58) Field of Classification Search ............ 365/185.27, 365/185.18, 185.22, 185.17
See application file for complete search history.

(56) References Cited

U.S. PATENT DOCUMENTS

| | | | |
|---|---|---|---|
| 6,049,494 A * | 4/2000 | Sakui et al. .............. 365/203 |
| 6,304,486 B1 | 10/2001 | Yano |
| 6,943,402 B2 | 9/2005 | Nagasaka et al. |
| 6,961,268 B2 | 11/2005 | Umezawa |
| 7,122,866 B2 | 10/2006 | Arai et al. |
| 7,136,306 B2 | 11/2006 | Xue et al. |
| 7,280,407 B2 | 10/2007 | Umezawa et al. |
| 7,525,838 B2 * | 4/2009 | Jung et al. ............. 365/185.03 |
| 2007/0136563 A1 * | 6/2007 | Park et al. .................... 712/220 |

FOREIGN PATENT DOCUMENTS

| | | |
|---|---|---|
| KR | 97-51375 | 7/1997 |
| KR | 1020030001611 | 1/2003 |

OTHER PUBLICATIONS

English Abstract for Publication No. 1997-51375.
English Abstract for Publication No. 1020030001611.

* cited by examiner

*Primary Examiner*—Vu A Le
(74) *Attorney, Agent, or Firm*—F. Chau & Associates, LLC (57) ABSTRACT

A method for programming a flash memory device with a plurality of memory cells. A selected memory cell is programmed under a condition where a bulk area is biased with a high voltage. A program pass/fail of the memory cell is verified with the high voltage applied to the bulk area.

27 Claims, 8 Drawing Sheets

FLASH MEMORY DEVICE AND PROGRAM METHOD THEREOF

CROSS-REFERENCE TO RELATED APPLICATIONS

This application claims priority under 35 U.S.C. § 119 to Korean Patent Application No. 10-2007-0008024, filed on Jan. 25, 2007, the entire contents of which are hereby incorporated by reference.

BACKGROUND OF THE INVENTION

1. Technical Field

The present invention relates to memory devices, and more particularly, to flash memory devices and program methods thereof.

2. Discussion of the Related Art

Recently, mobile devices have become smaller, thinner and lighter allowing for easy portability. In addition, a single semiconductor chip used in a smart card or an RFID tag must be able to implement a variety of functions. Therefore, system-on-chip (SoC) technology capable of implementing a central processing unit (CPU), a digital signal processor (DSP), a memory, etc. on one chip is being employed in semiconductor chips that are used in portable terminals or smart cards. A memory device mounted on the SoC of a portable terminal includes dynamic random access memories (DRAMs), static random access memories (SRAMs) and also nonvolatile memories such as flash memories. A volatile memory device has a high read/write operation speed but loses stored data when an external power supply is interrupted. On the contrary, a nonvolatile memory device can retain stored data even, when an external power supply is interrupted. Therefore, the nonvolatile memory device is used to store data (e.g., boot codes) that must be retained even without the external power supply. In general, a NOR flash memory with a high operation speed is widely used as a flash memory mounted on the SoC. The NOR flash memory has a high operation speed but is undesirable for high integration.

The demand for high integration is increasing in the fields of mobile devices or smart cards. For the smart cards, extensive research is being conducted to satisfy the need for high-speed write/read operations in one chip and the need for high-capacity storage. One of the attempts to satisfy the need for high speed/capacity is to install a NAND flash memory in a smart card chip. Hereinafter, such a NAND flash memory is referred to as an embedded NAND flash memory.

However, a NAND flash memory and a NOR flash memory are different in terms of the methods used for their programming. F-N tunneling is performed to inject electrons into a floating gate in the NAND flash memory, whereas hot electron injection is performed to inject electrons into a floating gate in the NOR flash memory. Therefore, the NAND flash memory and the NOR flash memory need different bias conditions. When the NAND flash memory and the NOR flash memory are mounted on one chip, multiple high-voltage generators are used to satisfy the different bias conditions.

SUMMARY OF THE INVENTION

Exemplary embodiments of the present invention provide a program method and a program verify method for an embedded NAND flash memory.

Exemplary embodiments of the present invention provide a program method and a program verify method capable of having a high program speed and the threshold voltage distribution of an embedded NAND flash memory.

Embodiments of the present invention provide program methods for a flash memory device with a plurality of memory cells. A selected memory cell is programmed under a condition where a bulk area is biased with a high voltage. A program pass/fail of the memory cell is verified with the high voltage applied to the bulk area.

In some exemplary embodiments, the high voltage is a negative high voltage.

In some exemplary embodiments, the programming of the selected memory cell includes applying a program voltage to a wordline connected to the selected memory cell.

In some exemplary embodiments, the programming of the selected memory cell further includes creating an electric field capable of F-N tunneling between the bulk area and a control gate of the memory cell.

In some exemplary embodiments, the verifying of the program pass/fail includes applying a verify voltage and a pass voltage respectively to a wordline connected to the selected memory cell and unselected wordlines that are not connected to the selected memory cell.

In some exemplary embodiments, the verify voltage and the pass voltage have a voltage level for compensating for a body effect that is caused due to the negative high voltage applied to the bulk area.

In some exemplary embodiments, the memory cells are NAND flash memory cells.

In some exemplary embodiments, the flash memory device is an embedded NAND flash memory device.

In some exemplary embodiments of the present invention, a flash memory device with a plurality of memory cells is programmed by programming a selected memory cell under a condition where a bulk area is biased with a high voltage. A high voltage charged in the bulk area is discharged to a ground voltage level. A program pass/fail of the memory cell is verified with the bulk area discharged to the ground voltage level.

In some exemplary embodiments, the high voltage is a negative high voltage.

In some exemplary embodiments, the programming of the selected memory cell includes applying a program voltage to a wordline connected to the selected memory cell.

In some exemplary embodiments, the programming of the selected memory cell further includes creating an electric field capable of F-N tunneling between the bulk area and a control gate of the memory cell.

In some exemplary embodiments, the verifying of the program pass/fail includes applying a verify voltage and a pass voltage respectively to a wordline connected to the selected memory cell and unselected wordlines that are not connected to the selected memory cell.

In some exemplary embodiments, the memory cells are NAND flash memory cells.

In some exemplary embodiments, the flash memory device is an embedded NAND flash memory device.

In some exemplary embodiments of the present invention, methods for programming a flash memory device with a plurality of memory cells include programming and verifying selected memory cells under a condition where a bulk area is biased with a high voltage. Selected memory cells are programmed under a condition where a bulk area is biased with the high voltage. A program pass/fail is verified with the high voltage discharged from the bulk area.

In some exemplary embodiments, the high voltage is a negative high voltage.

In some exemplary embodiments, the programming and verifying of the selected memory cells includes programming selected memory cells under a condition where a bulk area is biased with a high voltage. A program pass/fail of the memory cell is verified with the high voltage applied to the bulk area.

In some exemplary embodiments, the programming of the selected memory cells includes applying a program voltage to a wordline connected to the selected memory cells.

In some exemplary embodiments, the programming of the selected memory cells further includes creating an electric field capable of F-N tunneling between the bulk area and control gates of the selected memory cells.

In some exemplary embodiments, the verifying of the program pass/fail includes applying a verify voltage and a pass voltage respectively to a wordline connected to the selected memory cells and unselected wordlines that are not connected to the selected memory cells.

In some exemplary embodiments, the verify voltage and the pass voltage have a voltage level for compensating for a body effect that is caused by the negative high voltage applied to the bulk area.

In some exemplary embodiments, the programming and verifying of the selected memory cells includes a program loop where the programming of the selected memory cells and the verifying of the program pass/fail are performed repeatedly.

In some exemplary embodiments, the programming and verifying of the selected memory cells further includes detecting whether the number of program loops is equal to or greater than a predetermined value.

In some exemplary embodiments, the programming and verifying of the selected memory cells is repeated if the number of program loops is smaller than the predetermined value.

In some exemplary embodiments, the verifying of the program pass/fail is performed if the number of program loops is equal to or greater than the predetermined value.

In some exemplary embodiments, the programming and verifying of the selected memory cells further includes detecting the number of detected cells with the program fail, and detecting whether the number of the detected fail cells is smaller than a predetermined number.

In some exemplary embodiments, the programming and verifying of the selected memory cells is repeated if the number of the detected fail cells is equal to or greater than the predetermined number.

In some exemplary embodiments, the verifying of the program pass/fail is performed if the number of the detected fail cells is smaller than the predetermined number.

In some exemplary embodiments, the programming of the selected memory cells includes programming selected memory cells under a condition where the bulk area is biased with the negative high voltage. The negative high voltage charged in the bulk area is discharged to a ground voltage level. A program pass/fail of the memory cell is verified with the bulk area discharged to the ground voltage level.

In some exemplary embodiments, the programming of the selected memory cells includes applying a program voltage to a wordline connected to the selected memory cells.

In some exemplary embodiments, the programming of the selected memory cells further includes creating an electric field capable of F-N tunneling between the bulk area and a control gate of the memory cell.

In some exemplary embodiments, the verifying of the program pass/fail includes applying a verify voltage and a pass voltage respectively to a wordline connected to the selected memory cells and unselected wordlines that are not connected to the selected memory cells.

In some exemplary embodiments, the memory cells are NAND flash memory cells.

In some exemplary embodiments, the flash memory device is an embedded NAND flash memory device.

In some exemplary embodiments of the present invention, flash memory devices include a cell array including a plurality of memory cells. A page buffer is configured to perform a program operation of selected memory cells. A voltage supplier provides voltages for the program operation to a bulk area, wordlines, and select lines of the cell array. A program controller controls the voltage supplier and the page buffer to supply a negative high voltage and a program voltage or a verify voltage respectively to the bulk area and the wordlines during the program operation.

In some exemplary embodiments, the program operation includes a program period for programming the selected memory cells under a condition where the bulk area is biased with the negative high voltage, and a verify period for verifying a program pass/fail of the selected memory cells with the negative high voltage applied to the bulk area.

In some exemplary embodiments, the program operation includes a program period for programming the selected memory cells under a condition where the bulk area is biased with a high voltage, a discharge period for discharging the bulk area to a ground voltage level, and a verify period for verifying a program pass/fail of the selected memory cells with the bulk area discharged to the ground voltage level.

In some exemplary embodiments of the present invention, smart cards include a high-voltage generator for providing a plurality of high voltages. A NAND flash memory device performs a program operation using the high voltages received from the high-voltage generator.

In some exemplary embodiments, the NAND flash memory device is an embedded NAND flash memory device.

In some exemplary embodiments, the NAND flash memory device includes a cell array including a plurality of memory cells. A page buffer is configured to perform a program operation of selected memory cells. A voltage supplier provides voltages for the program operation to a bulk area, wordlines, and select lines of the cell array. A program controller controls the voltage supplier and the page buffer to supply a negative high voltage and a program voltage or a verify voltage respectively to the bulk area and the wordlines during the program operation.

In some exemplary embodiments, the program operation includes a program period for programming the selected memory cells under a condition where the bulk area is biased with the negative high voltage, and a verify period for verifying a program pass/fail of the selected memory cells with the negative high voltage applied to the bulk area.

In some exemplary embodiments, the program operation includes a program period for programming the selected memory cells under a condition where the bulk area is biased with a high voltage, a discharge period for discharging the bulk area to a ground voltage level, and a verify period for verifying a program pass/fail of the selected memory cells with the bulk area discharged to the ground voltage level.

In some exemplary embodiments, the smart cards further include a NOR flash memory device performing a program operation using the high voltages received from the high-voltage generator.

BRIEF DESCRIPTION OF THE DRAWINGS

The accompanying figures are included to provide a further understanding of exemplary embodiments of the present invention. The drawings illustrate exemplary embodiments of the present invention. In the figures.

DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein.

Like reference numerals may refer to like elements throughout the disclosure and figures.

Below, a flash memory device is used as one example for illustrating features and functions of exemplary embodiments of the present invention. The present invention may be embodied or applied through other embodiments.

An exemplary embodiment of the present invention is described below in conjunction with the accompanying drawings.

Figure 1:
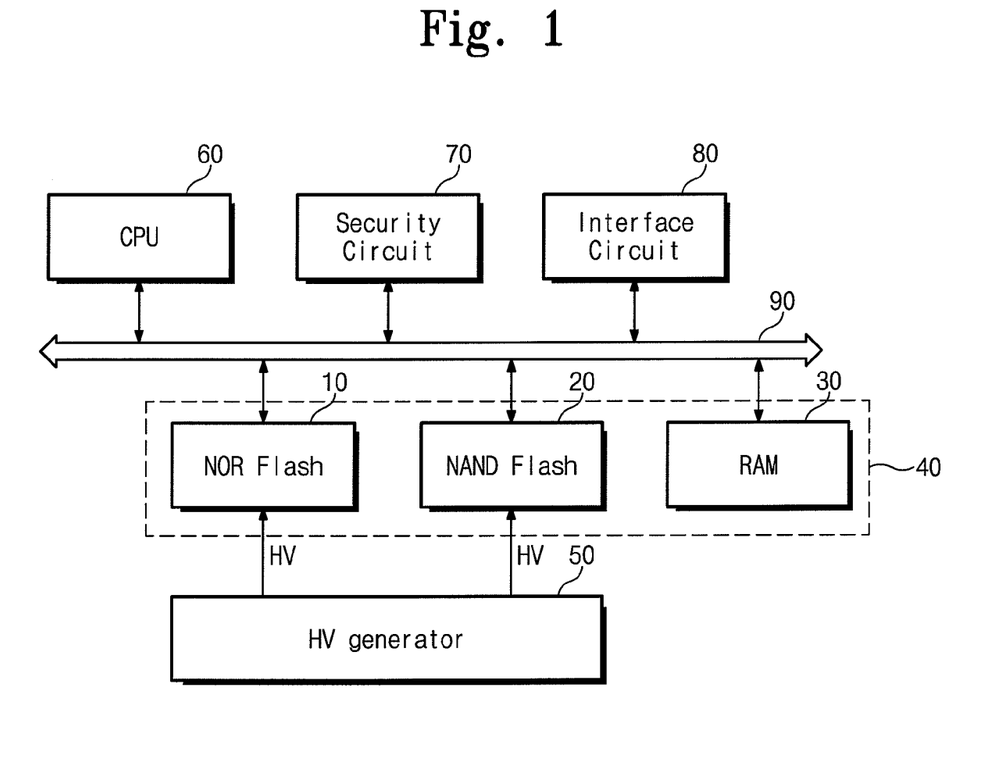
FIG. 1 is a block diagram of a smart card with an embedded NAND flash memory according to an exemplary embodiment of the present invention.

FIG. 1 is a block diagram of a smart card according to an exemplary embodiment of the present invention.

Referring to FIG. 1, the smart card includes a memory block 40 for an operation thereof and a high-voltage generator 50 for providing a nigh voltage necessary for driving a non-volatile memory.

The memory block 40 includes a NOR flash memory 10 as a code memory. A cell array of the NOR flash memory 10 is divided into a plurality of memory areas (e.g., banks and blocks). The program/erase operations of the NOR flash memory 10 are performed in units of the memory area. The NOR flash memory 10 programs a memory cell according to the hot-electron injection scheme.

For the program operation, a program current of a predetermined level or higher is used because a high voltage of about 5 V and a high voltage of about 10 V are applied respectively to the drain and gate of the memory cell. The above high voltages are generated by the high-voltage generator 50 of the smart card. In general, a flash memory device performs an erase operation in units of blocks. In the NOR flash memory 10, an erase voltage of about 6-8 V is applied to a bulk of a block unit area and a negative voltage of about −10 V is applied to a wordline. When a bit line and a common sourceline of the memory cell are maintained in a floating state, electrons injected into a floating gate are erased by F-N tunneling to perform an erase operation.

A NAND flash memory 20 uses the same high voltage HV as the NOR flash memory 10. In a general NAND flash memory device that is not an embedded system, a high voltage of about 18 V is applied to a selected wordline in a program operation and a high voltage of about 20 V is applied to a bulk area in an erase operation. Providing an embedded system with a separate high voltage generator for generation of such high voltages may be expensive and inefficient. Therefore, the bias conditions of the NAND flash memory may be set to 20 to be within the range of the high voltages supplied to the NOR flash memory 10. An electric field is created with sufficient strength to induce F-N tunneling between the channel and control gate of the memory cell. For example, a voltage of about −6 V and a voltage of about 10 V are applied respectively to the bulk area and the selected wordline to program the memory cell.

A RAM 30 is used as an operating memory of the smart card. Boot codes or other operating programs, stored in the NOR flash memory 10, are stored in the RAM 30.

The high-voltage generator 50 generates a voltage that is lower than a high voltage (e.g., about 20 V) used in the general NAND flash memory device. The high-voltage generator 50 generates a bias voltage for the NOR flash memory 10 and bias voltages for the NAND flash memory 20. Therefore, charge pumps for generation of high voltages need not have a relatively large size.

A CPU 60 performs control operations for the smart card. A security circuit 70 encrypts and/or decrypts data transferred through an interface circuit 80. The interface circuit 80 is used to exchange data with a host or an external device for data transfer of the smart card. An internal bus 90 is used as a channel for transfer of internal data of the smart card.

The embedded NAND flash memory 20 according to an exemplary embodiment of the present invention can perform program, erase and read operations within the range of the high voltages supplied to the NOR flash memory 10.

Figure 2:
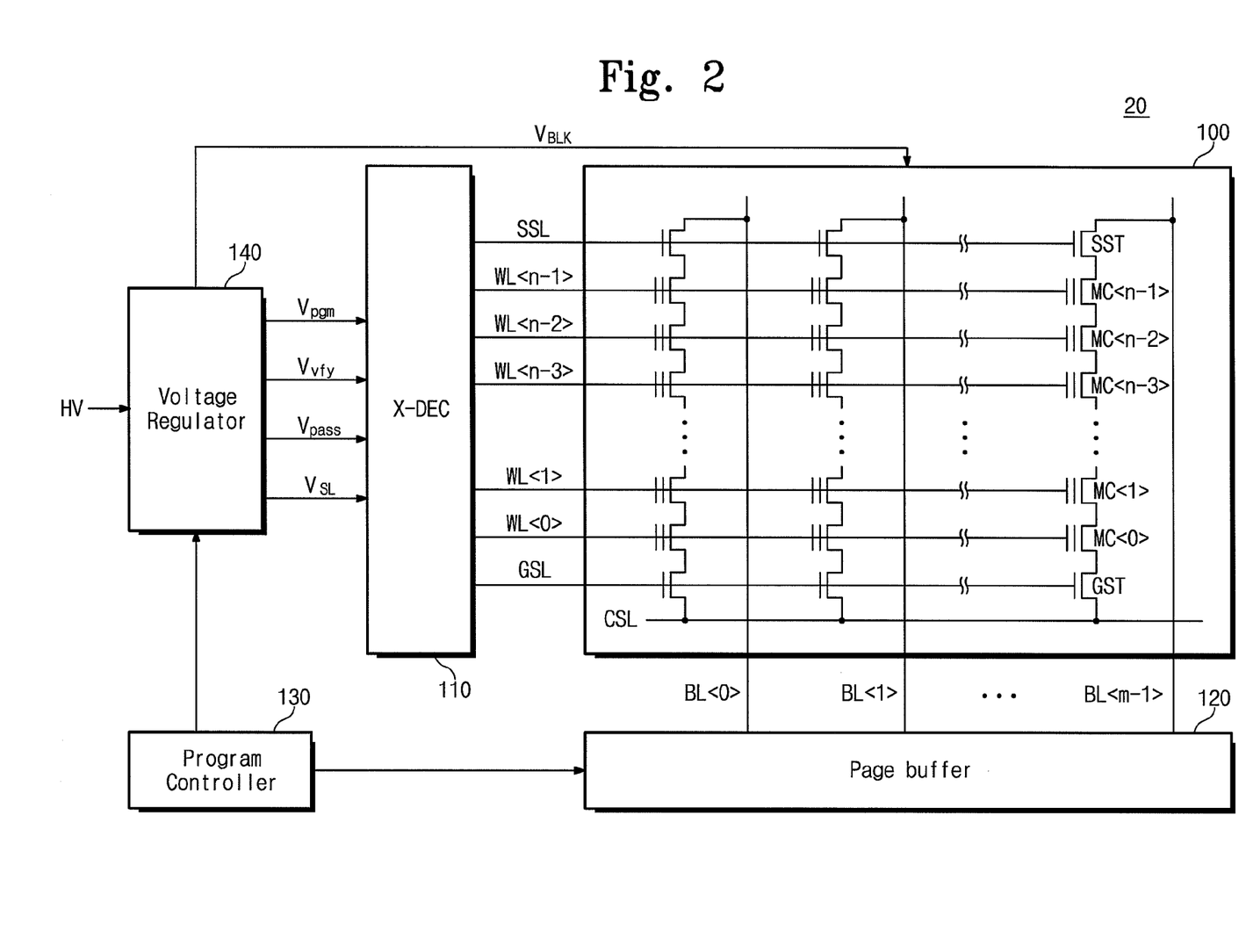
FIG. 2 is a block diagram of the embedded NAND flash memory illustrated in FIG. 1.

FIG. 2 is a block diagram of the NAND flash memory 20 illustrated in FIG. 1.

Referring to FIG. 2, in a program operation of the NAND flash memory 20, a voltage of about −6 V and a high voltage of about 10 V are applied respectively to a bulk area and a selected wordline. In a program verify operation for determining whether a program operation has passed or failed (hereinafter simply referred to as "program pass/fail"), the NAND flash memory 20 may perform a first verify operation that is to be performed after discharge of a negative high voltage that is applied to the bulk area for the program operation. Alternatively, the NAND flash memory 20 may determine the program pass/fail according to a second verify operation that is to be performed without discharge of the negative high voltage applied to the bulk area.

A cell array 100 includes NAND flash memories suitable for high integration. The NAND flash memories are divided into a plurality of memory blocks that are the basic unit of an erase operation. Each of the memory blocks includes a plurality of strings. Each of the strings includes a string select transistor (SST), a ground select transistor (GST), and memory cells (MCs) <n−1> through <0>. The SST is controlled by a string select line (SSL) and has a drain connected to a corresponding bitline (BL). The GST is controlled by a ground select line (GSL) and has a source connected to a common sourceline (CSL). The MCs <n−1> through <0> are connected in series between a source of the SST and a drain of the GST and are controlled by corresponding wordlines (WLs) <n−1> through <0>. In a program operation, a negative high voltage $V_{BLK}$ of about −6V is applied to a bulk area of the cell array 100. For the first verify operation, the negative high voltage applied to the bulk area is discharged to about 0 V. For the second verify operation, the program verify operation may be performed even without discharge of the negative high voltage applied to the bulk area.

A row decoder (X-DEC) 110 selects a wordline (WL) in response to a row address. The row decoder 110 receives a variety of WL voltages from a voltage regulator 140 and transfers the received wordline voltages to selected wordlines. In the program operation, a program voltage $V_{pgm}$ of about 10 V and a pass voltage $V_{pass}$ of about 3 V are transferred respectively to a selected WL and an unselected WL. The row decoder 110 transfers a voltage of about 0 V and a voltage of about −6 V respectively to the SSL and the GSL. In the program verify operation, the row decoder 110 provides the SSL, the GSL, and the WLs with voltages for the verify operation that are received from the voltage regulator 140. For example, a voltage of about 5 V, a voltage of about 2 V, a voltage of about 5 V, and a voltage of about 2 V are provided respectively to the SSL, a selected WL, a unselected WL, and the GSL in the first verify operation. A voltage of about 0 V, a voltage of about 0 V, a voltage of about 3 V, and a voltage of about 2 V are provided respectively to the SSL, a selected WL, a unselected WL, and the GSL in the second verify operation.

A page buffer 120 functions as a write driver or a sense amplifier according to a current operation mode. For example, the page buffer 120 functions as a sense amplifier in a read operation mode and functions as a write driver in a program operation mode. In the program operation, the page buffer 120 provides a voltage of about −6 V to a BL where data '0' is programmed, and provides a voltage of about 0 V to a BL that is set to be 'Program Inhibit.' In the first verify operation, the page buffer 120 provides a voltage of about 1 V to all BLs to detect the program pass/fail.

A program controller 130 controls the page buffer 120 and the voltage regulator 140 according to a prescribed program algorithm. The program controller 130 may perform one of the first verify operation and the second verify operation for program verification. Alternatively, the second verify operation is performed for program verification. The first verify operation is performed for program verification when a predetermined condition is satisfied.

The voltage regulator 140 receives a high voltage HV from the high-voltage generator 50, divides the received high voltage HV into subvoltages with levels suitable for the respective operation modes, and provides the subvoltages to the row decoder 110 or the bulk area of the cell array 100. In the program operation, the voltage regulator 140 provides the row decoder 110 with a select voltage $V_{SL}$ to be provided to the select lines SSL and GSL, a program voltage $V_{pgm}$ to be provided to a selected WL, and a pass voltage $V_{pass}$ to be provided to unselected WLs. In addition, the voltage regulator 140 transfers a bulk voltage $V_{BLK}$ of about −6 V to the bulk area of the cell array 100. Upon completion of the program operation, the voltage regulator 140 provides the cell array 100 or the row decoder 110 with voltages for the first verify operation or the second verify operation.

In the first verify operation, the voltage regulator 140 provides a bulk voltage $V_{BLK}$ of about 0 V to the cell array 100. At this point, negative charges in the bulk area of the cell array 100 are discharged. Upon completion of the discharge of the bulk area, the voltage regulator 140 provides WL voltages to be transferred from the row decoder 110 to the cell array 100. The voltage regulator 140 provides voltages to the row decoder 110 and a voltage of about 5 V, a voltage of about 2 V, a voltage of about 5 V, and a voltage of about 2 V are provided respectively to the SSL, a selected WL, an unselected WL, and the GSL. During the first verify operation, the voltage regulator 140 provides a bulk voltage $V_{BLK}$ with a fixed level of about 0 V to the bulk area of the cell array 100.

In the second verify operation, the program results are verified without discharge of negative charges in the bulk area. For example, the voltage regulator 140 continuously provides a bulk voltage $V_{BLK}$ of about −6 V to the bulk area during the second verify operation. The voltage regulator 140 provides a high voltage as a source voltage so that the row decoder 110 transfers WL voltages for program verification to the cell array 100 without discharge of the bulk area. For example, the voltage regulator 140 provides high voltages to the row decoder 110 so that a voltage of 0V, a voltage of about 0 V, a voltage of about 3 V, and a voltage of about 2 V are provided respectively to the SSL, a selected WL, an unselected WL, and the GSL. The levels of the WL voltages are determined in consideration of the body effect of the memory cell that occurs while a negative voltage is being provided to the bulk area. During the second verify operation, the voltage regulator 140 provides a bulk voltage $V_{BLK}$ with a fixed level of about −6 V to the bulk area of the cell array 100. Table 1 below illustrates exemplary voltages that are applied to the respective components during the program operation, the first verify operation and the second verify operation.

TABLE 1

(numeric table entries are in units of Volts)

| | Program execution | First verify operation | Second verify operation |
|---|---|---|---|
| SSL | 0 | 5 | 0 |
| Sel.WL | 10 | 2 | 0 |
| Unsel.WL | 3 | 5 (Pass) | 3 (Pass) |
| GSL | −6 | 2 | 2 |
| CSL | 1 | 0 | 0 |
| '0' BL | −6 | 1 | 1 |
| '1' BL | 0 | 1 | 1 |
| Bulk | −6 | 0 (Discharged) | −6 (Undischarged) |

The levels of the program, operation voltages and the verify operation voltages are offered as examples, and the present invention is not limited to these examples. Below, exemplary embodiments of the present invention will be described in detail with reference to the exemplary voltage levels illustrated in Table 1 above. It should be apparent to those skilled in the art that the scope of the present invention is not limited by the exemplary voltage levels in Table 1.

As described above, the NAND flash memory 20 biases the bulk area of the cell array 100 to a negative high voltage and provide a program voltage to the WLs. The program verification may be performed using the first verify operation where a verify voltage is applied after discharge of negative charges in the bulk area. Alternatively, the program verification may be performed using the second verify operation where a verify voltage determined considering the body effect is applied without discharge of the bulk area and the time required for discharge of the negative charges may accordingly be reduced.

Figure 3:
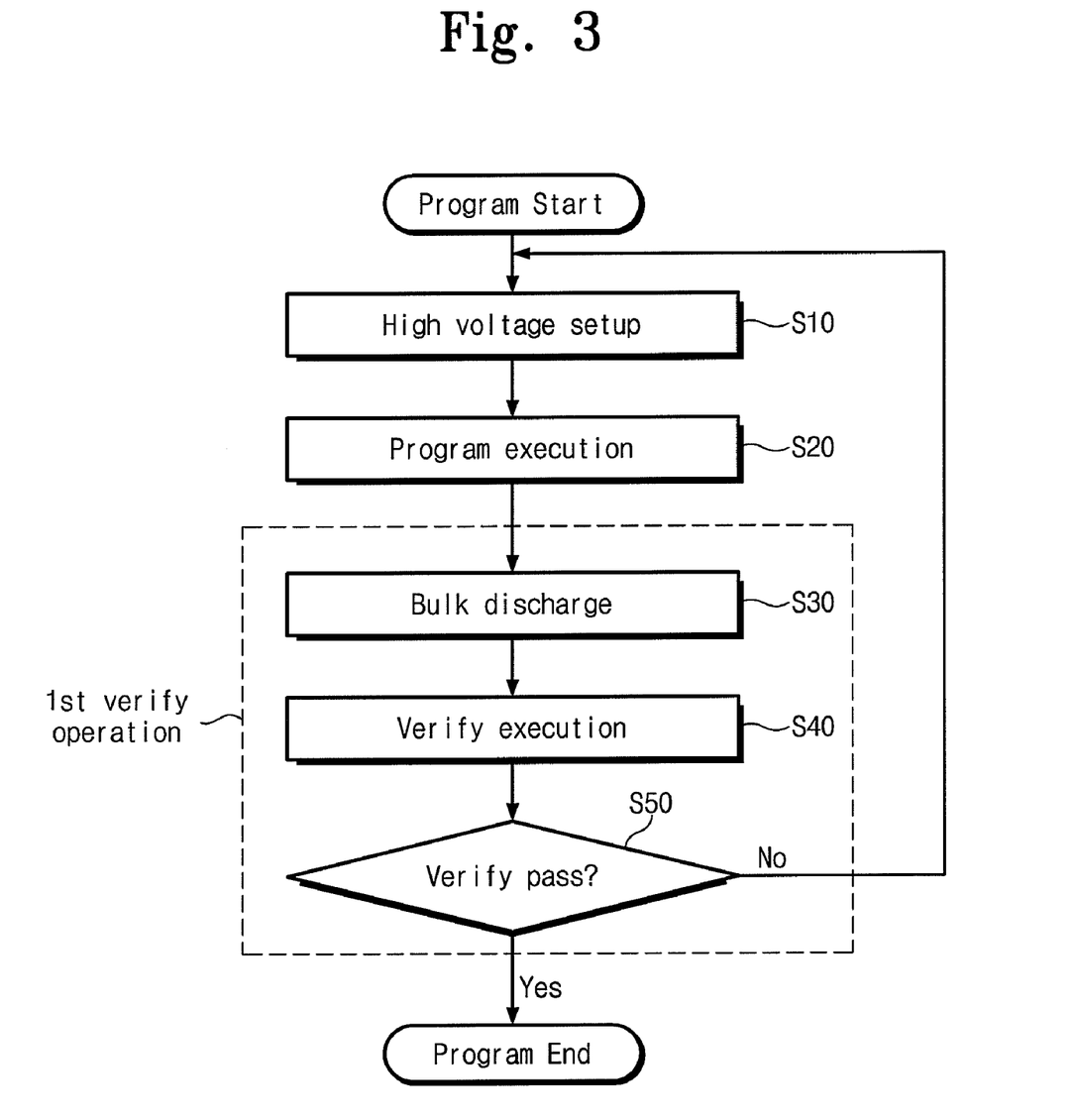
FIG. 3 is a flowchart illustrating a program operation of the embedded NAND flash memory according to an exemplary embodiment of the present invention.

FIG. 3 is a flowchart illustrating a program operation of the embedded NAND flash memory according to an exemplary embodiment of the present invention. Specifically, FIG. 3 illustrates a program operation including the first verify operation that is performed by the program controller 130 (see FIG. 2).

Referring to FIG. 3, a discharge of negative charges in the bulk area is performed for each program loop (step S30). The program operation including the first verify operation will be described in detail below with reference to the accompanying drawings.

Upon initiation of the program operation, the program controller 130 performs a high-voltage setup operation and distributes a high voltage received from the high-voltage generator 50 to a bulk area and wordlines and select lines of memory cells. The program controller 130 controls the voltage regulator 140 and transfers a negative high voltage of about −6 V to the bulk area. In addition, the program controller 130 controls the voltage regulator 140 and transfers a program voltage $V_{pgm}$ and a pass voltage $V_{pass}$ to the select lines SSL and GSL and the wordlines. For example, the program controller 130 controls the voltage regulator 140 and the row decoder 110 and activates program execution voltages illustrated in Table 1. An operation of generating an internal nigh voltage (Vpp) may be included in the high-voltage setup operation (step S10). Upon completion of the voltage setup, the program controller 130 supplies the high voltages to the bulk area, the select lines, and the wordlines and executes a program. During the program execution, there is a potential difference of about 16 V between the bulk area and a selected wordline. This potential difference of about 16 V creates an electric field, which has a strength capable of inducing F-N tunneling, at a floating gate of a memory cell to be programmed with data '0.' A voltage of about 0 V is applied to a bitline of a memory cell to be programmed with data '1,' thereby setting the memory cell to be 'Program Inhibit' (step S20). After completion of application of a pulse voltage (e.g., ISPP) for the program operation, a verify operation is performed and it is determined whether a program pass/fail. Negative charges in the bulk area are removed and the first verify operation is performed. Accordingly, a voltage of about 0 V or a ground voltage is provided to the bulk area to discharge the negative charges (step S30). After completion of the discharge of the bulk area, wordline voltages are provided and the program operation of the memory cell is verified (step S40). By the verify operation, the program controller 130 determines the program pass/fail with reference to data latched at the page buffer 120 (step S50). If there is a program fail in the selected memory cells, the program operation returns to step S10 to perform a re-program operation. If there is no program fail in the selected memory cells, the program operation is ended. Steps S30 through S50 for performing the verify operation after the discharge of the negative high voltage charged in the bulk area for the program operation constitute the first verify operation.

According to the program operation including the first verify operation, the verify operation is performed after removal of the negative high voltage supplied to the bulk area. Accordingly, a change in a threshold voltage of the memory cell need not be considered due to the body effect. A predetermined amount of time is taken to discharge the negative charges in the bulk area. Accordingly, the program operation, including the first verify operation, takes a predetermined amount of time for the discharge of the bulk area.

Figure 4:
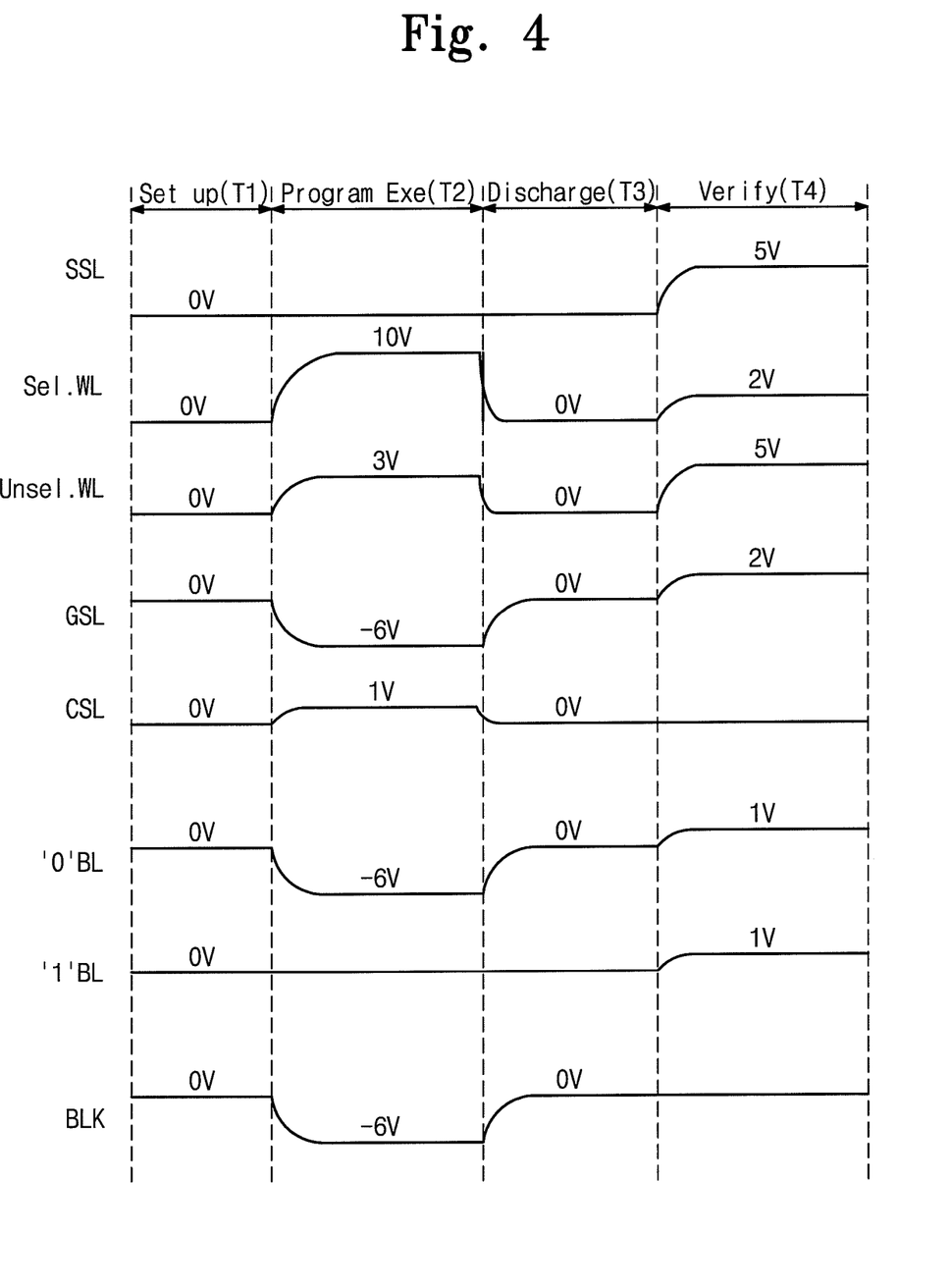
FIG. 4 is a waveform diagram illustrating bias states according to the program operation illustrated in FIG. 3.

FIG. 4 is a waveform diagram illustrating bias states according to the program operation illustrated in FIG. 3. Specifically, FIG. 4 illustrates voltages that are applied during the program operation including the first verify operation.

Referring to FIG. 4, the voltage regulator 140 sets high voltages during a high-voltage setup period T1. During a program execution period T2, the high voltages from the voltage regulator 140 are provided to select lines, wordlines, and a bulk area. Specifically, a negative nigh voltage $V_{BLK}$ of about −6 V and a program voltage $V_{pgm}$ of about 10 V are provided respectively to a bulk area and a select wordline (Sel.WL). Bitline voltages corresponding to program data are provided to bitlines. A negative high voltage of about −6 V is provided to a bitline '0' BL corresponding to data '0,' and a program inhibit voltage of about 0 V is provided to a bitline '1' BL corresponding to data '1.'

After termination of the program execution period T2, a discharge period T3 is performed to discharge a negative high voltage of the bulk area to a ground voltage level. An equivalent capacitance corresponding to the bulk area is relatively large, and the discharge time of the negative charges is also relatively long. Therefore, a delay time is provided until the bulk area is set to have a voltage of about 0 V. This delay time acts as a factor reducing the program speed.

Upon termination of the discharge period T3, a voltage of about 0 V, a voltage of about 2 V, a voltage of about 5 V, and a voltage of about 1 V are applied respectively to the bulk area, the selected wordline, the unselected wordlines, and the wordlines, and a verify operation T4 is performed for the memory cell. The negative charges in the bulk area are discharged, and the threshold voltage of the memory cell is not affected by the body effect. Accordingly, the threshold voltage characteristics between the memory cells can be made uniform. Therefore, the verify operation can be performed more efficiently and the threshold voltage distribution can be controlled more precisely.

The first verify operation uses the discharge time for the negative charges in the bulk area, leading to a decrease in the program speed. In addition, when the program loop is performed repeatedly, the discharge/charge of the negative high voltage is performed repeatedly. Accordingly, the program operation including the first verify operation decreases the program speed.

Figure 5:
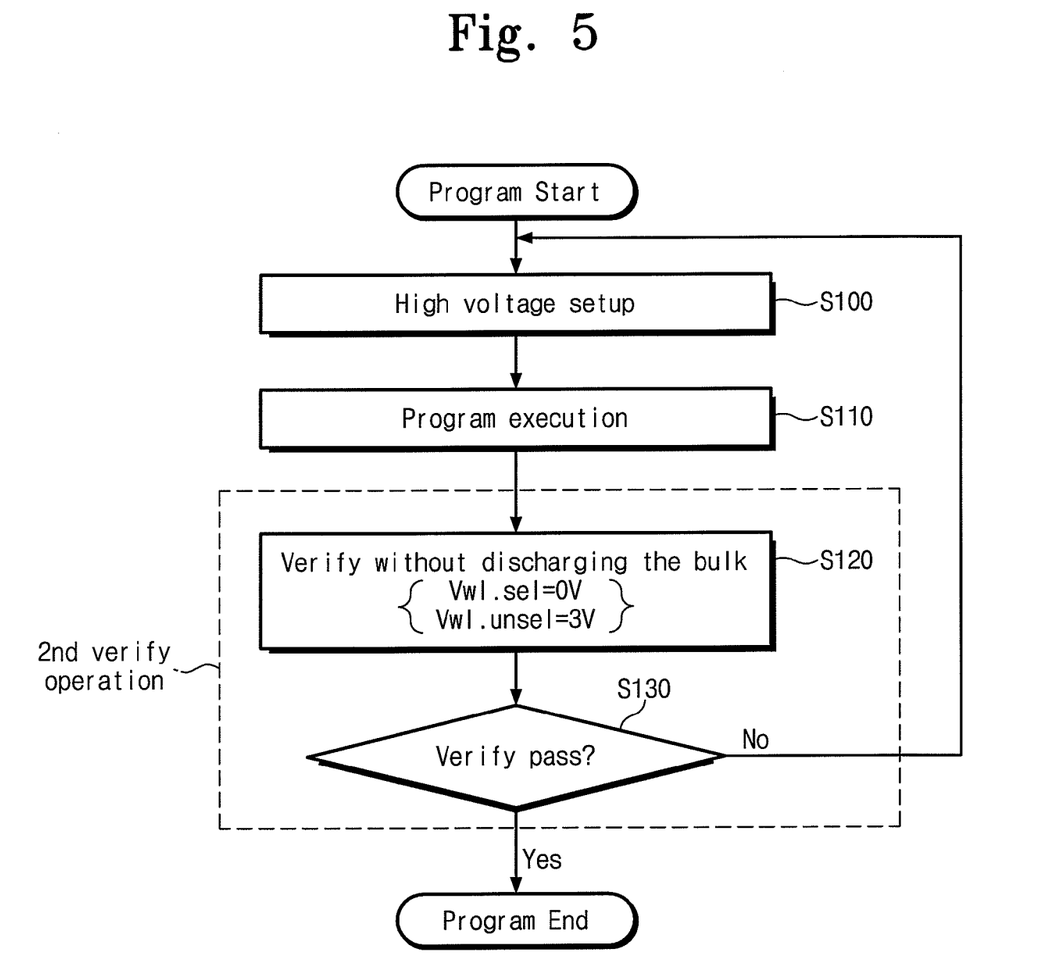
FIG. 5 is a flowchart illustrating a program operation of the embedded NAND flash memory according to an exemplary embodiment of the present invention.

FIG. 5 is a flowchart illustrating a program operation of the embedded NAND flash memory according to an exemplary embodiment of the present invention. Specifically, FIG. 5 illustrates a program operation including the second verify operation that is performed by the program controller 130. In the second verify operation, the program verify operation for the memory cell is performed without discharge of the bulk area. The program operation including the second verify operation is described in detail below with reference to the accompanying drawings.

Upon initiation of the program operation, the program controller 130 performs a high-voltage setup operation and a high voltage received from the high-voltage generator 50 is distributed to a bulk area, wordlines and select lines of memory cells. The program controller 130 controls the voltage regulator 140 and transfers a negative high voltage of about −6 V to the bulk area. In addition, the program controller 130 controls the voltage regulator 140 and transfers a program voltage $V_{pgm}$ and a pass voltage $V_{pass}$ to the select lines SSL and GSL and the wordlines. For example, the program controller 130 controls the voltage regulator 140 and the row decoder 110 and activates program execution voltages illustrated in Table 1 (step S100). Upon completion of the voltage setup, the program controller 130 supplies the high voltages to the bulk area, the select lines, and the wordlines and thus executes a program. During the program execution, there is a potential difference of about 16 V between the bulk area and a selected wordline. This potential difference of about 16 V creates an electric field, which is capable of inducing F-N tunneling, at a floating gate of a memory cell to be programmed with data '0.' A voltage of about 0 V is applied to a bitline of a memory cell to foe programmed with data '1,' thereby setting the memory cell to be 'Program Inhibit' (step S110). After completion of application of a pulse voltage (e.g., ISPP) for the program operation, a verify operation is performed to determine a program pass/fail. However, according to the second verify operation, verify voltages are provided to corresponding ports while maintaining the negative high voltage of the bulk area. Because the bulk area is biased with the negative high voltage in the second verify operation, the second verify operation can determine a program pass/fail using a lower wordline voltage, when compared to the first verify operation. However, the verify voltages provided to wordlines are determined considering the body effect due to the bulk area charged with the negative high voltage. Accordingly, in order to compensate for the increased threshold voltage of the memory cell in consideration of the body effect, the wordline voltage is slightly higher than a voltage reflecting the negative high voltage applied to the bulk area. In the second verify operation, a voltage of about 0 V and a voltage of about 3 V are applied respectively to the selected wordline and the unselected wordlines. This wordline voltage in the second verify operation compensates for the body effect that is caused due to the voltage of about −6 V applied to the bulk area (step S120). By the above verify operation, the program controller 130 determines the program pass/fail with reference to data latched at the page buffer 120 (step S130). If there is a program fail in the selected memory cells (No, Step S130), the program operation returns to step S100 to perform a re-program operation. If there is no program fail in the selected memory cells (Yes, Step S130), the program operation is ended. Steps S120 and S130 for performing the verify operation while maintaining the negative high voltage charged in the bulk area for the program operation constitute the second verify operation.

According to the program operation including the second verify operation, the verify operation is performed while maintaining the negative high voltage supplied to the bulk area. Accordingly, a change in a threshold voltage of the memory cell due to the body effect is considered. Because there is no need to discharge the negative charges in the bulk area, the second embodiment can increase the program speed.

Figure 6:
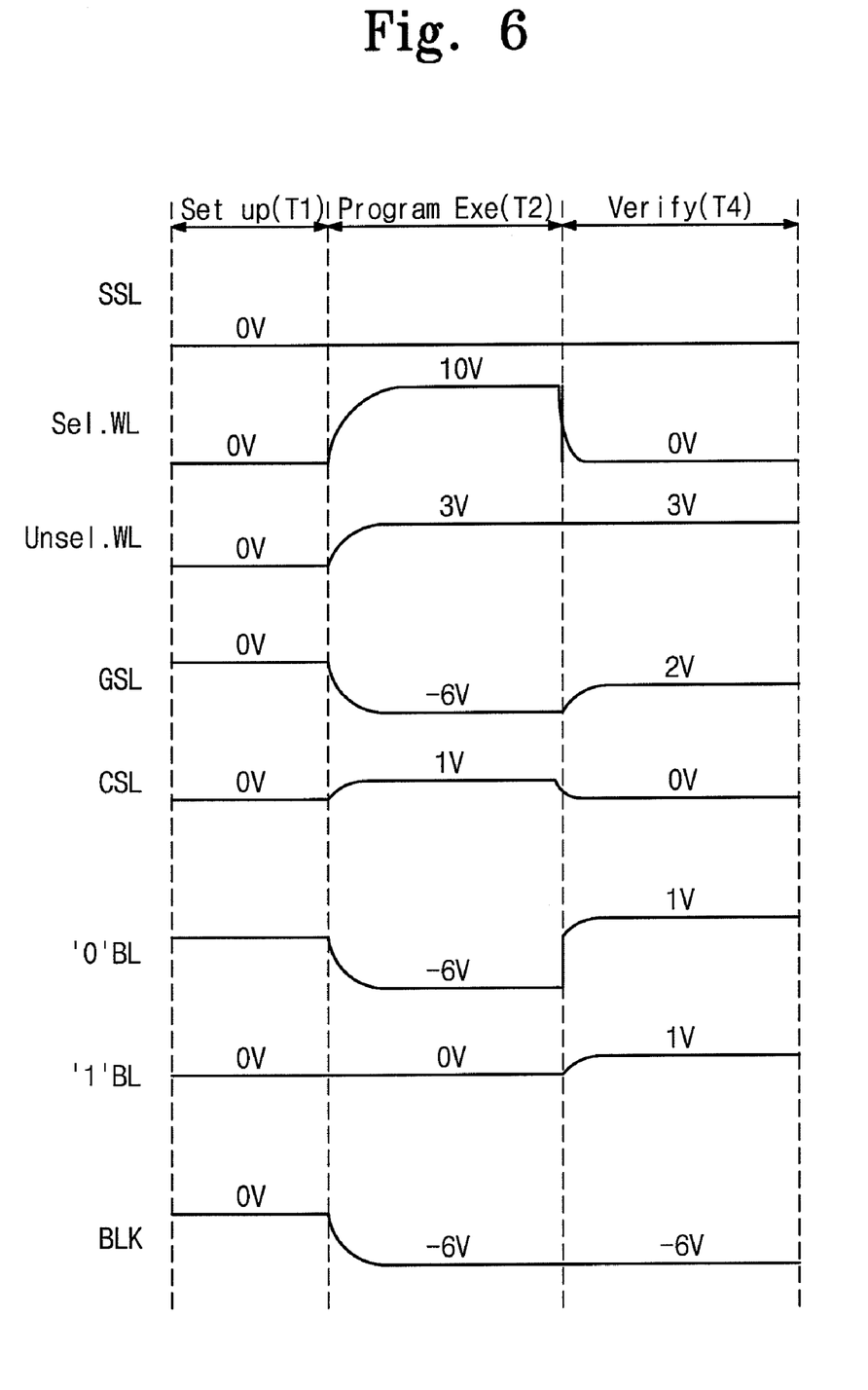
FIG. 6 is a waveform diagram illustrating bias states according to the program operation illustrated in FIG. 5.

FIG. 6 is a waveform diagram illustrating bias states according to the program operation illustrated in FIG. 5. Specifically, FIG. 6 illustrates voltages that are applied to the corresponding components during the program operation including the second verify operation.

Referring to FIG. 6, bias conditions for performing the program operation without discharge of the bulk area are illustrated step by step.

High voltages, which are provided by the voltage regulator 140 during a nigh-voltage setup period T1 and a program execution period T2, are similar to those in FIG. 4. However, unlike the first verify operation, the second verify period (operation) T4 is performed after the program execution period T2 without discharged of the bulk area. For example, verify voltages are provided to wordlines and bitlines while maintaining a negative high voltage of about −6 V in the bulk area. The verify voltages provided to the wordlines are determined in consideration of the body effect that is caused due to the negative high voltage provided to the bulk area. The body effect refers to a change in a threshold voltage of the memory cell according to a bulk bias. The free charge density of in a channel of the memory cell changes according to the state of the bulk bias. A threshold voltage (Vth) of the memory cell changes according to the free charge density in the channel. Equation (1) below briefly illustrates the body effect where the threshold voltage (Vth) changes according to a change in a bulk voltage.

$$\mathrm{Vth} = \mathrm{Vth}_0 + \eta [\sqrt{V_{BLK} + 2\phi_f} - \sqrt{2\phi_f}] \quad (1)$$

where $\eta$ is a process constant and $\phi_f$ is a physical constant.

For example, a voltage of about 0 V and a voltage of about 3 V are applied respectively to the selected wordline and the unselected wordlines.

As described above, the program operation including the second verify operation does not need to discharge the negative charges in the bulk area. Accordingly, the charge/discharge time consumption can be minimized even when the program loop is repeated. Therefore, the program operation including the second verify operation can increase the program speed of the flash memory.

Figure 7:
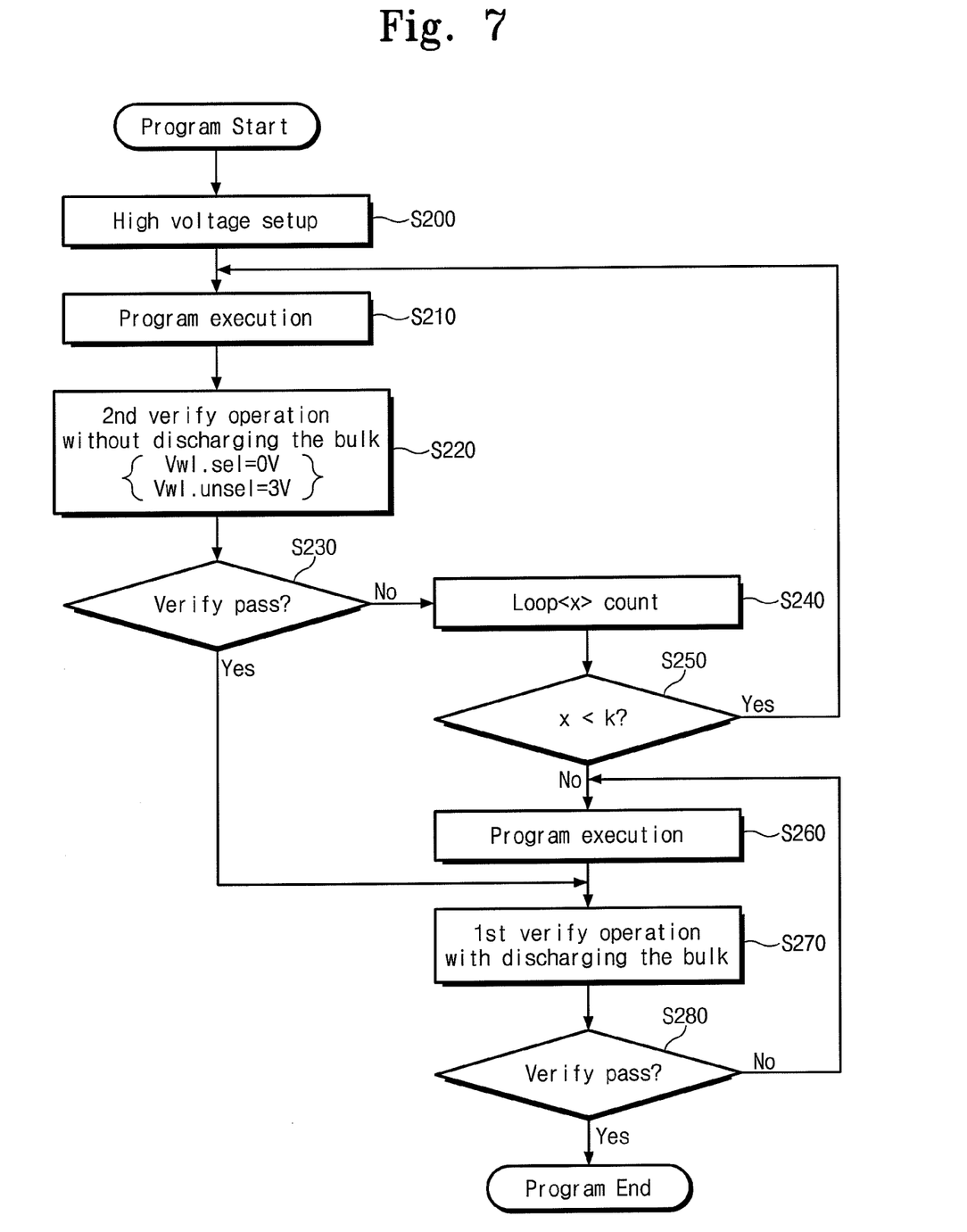
FIG. 7 is a flowchart illustrating a program operation of the embedded NAND flash memory according to an exemplary embodiment of the present invention.

FIG. 7 is a flowchart illustrating a program operation of the embedded NAND flash memory according to a third embodiment of the present invention. Specifically, FIG. 7 illustrates a procedure for performing the first verify operation and the second verify operation selectively according to the number of program loops.

Referring to FIG. 7, in a program period where the number of program loops is smaller than a predetermined value k, the program operation is performed according to the second verification operation. Thereafter, if the number of program loops is equal to or greater than the predetermined value, the program operation is performed according to the first verification operation. An example is as follows:

Upon initiation of the program operation, the program controller 130 performs a high-voltage setup operation to set high voltages to be provided to the bulk area and the wordlines (step S200). Thereafter, the program controller 130 performs operations for program execution. For example, using the set high voltages, the program controller 130 controls the voltage regulator 140 and applies a voltage of about −6 V to the bulk area. Likewise, the program controller 130 controls the row decoder 110 and applies a voltage of about 10 V and a voltage of about 3 V to the selected wordline and the unselected wordlines, respectively (step S210). Thereafter, the second verify operation is performed and a program pass/fail is verified (step S220). If there is no program fail in the selected memory cells (Yes, Step S230), the procedure proceeds to step S270 for the first verify operation. On the other hand, if the there is any program fail in the selected memory cells (No, Step S230), the program controller 130 counts the current program number 'x' (step S240). If the current loop number 'x' is smaller than a predetermined loop number 'k,' (Yes, Step S250) the procedure returns to step S210 for a re-program, operation. On the other hand, if the current loop number 'x' is equal to or greater than the predetermined loop number 'k,' (No, Step S250) the procedure proceeds to step S260 to verify a program pass/fail by the first verify operation. Thereafter, the selected memory cells are programmed with the bulk area charged with a negative high voltage (step S260). Thereafter, the first verify operation is performed for program verification (step S270). If the result of the first verify operation is determined to be 'program fail,' (No, Step S280) the procedure returns to step S260 for a re-program operation. On the other hand, if the result of the first verify operation is determined to be 'program pass,' (Yes, Step S280) the procedure is ended.

According to the program method of the exemplary embodiment described above, the memory cell program is verified according to the second verify operation when the number of program loops is smaller than the predetermined loop number. The memory cell program is verified according to the first verify operation when the number of program loops is equal to or greater than the predetermined loop number. The reason for this is that the body effect of the memory cells becomes different when the program operation is performed using only the second verify operation. When an increase in a threshold voltage due to the body effect is different in each memory cell, the threshold voltage distribution of the memory cells increases and the read margin decreases. However, when the first verify operation without the body effect is used for the latter loops in the program cycle, the threshold voltage distribution can be set precisely. For example, the second verify operation can increase the program speed and the first verify operation can more precisely control the threshold voltage distribution. Consequently, exemplary embodiments of the present invention, make it possible to increase the program speed and to more precisely control the threshold voltage distribution.

Figure 8:
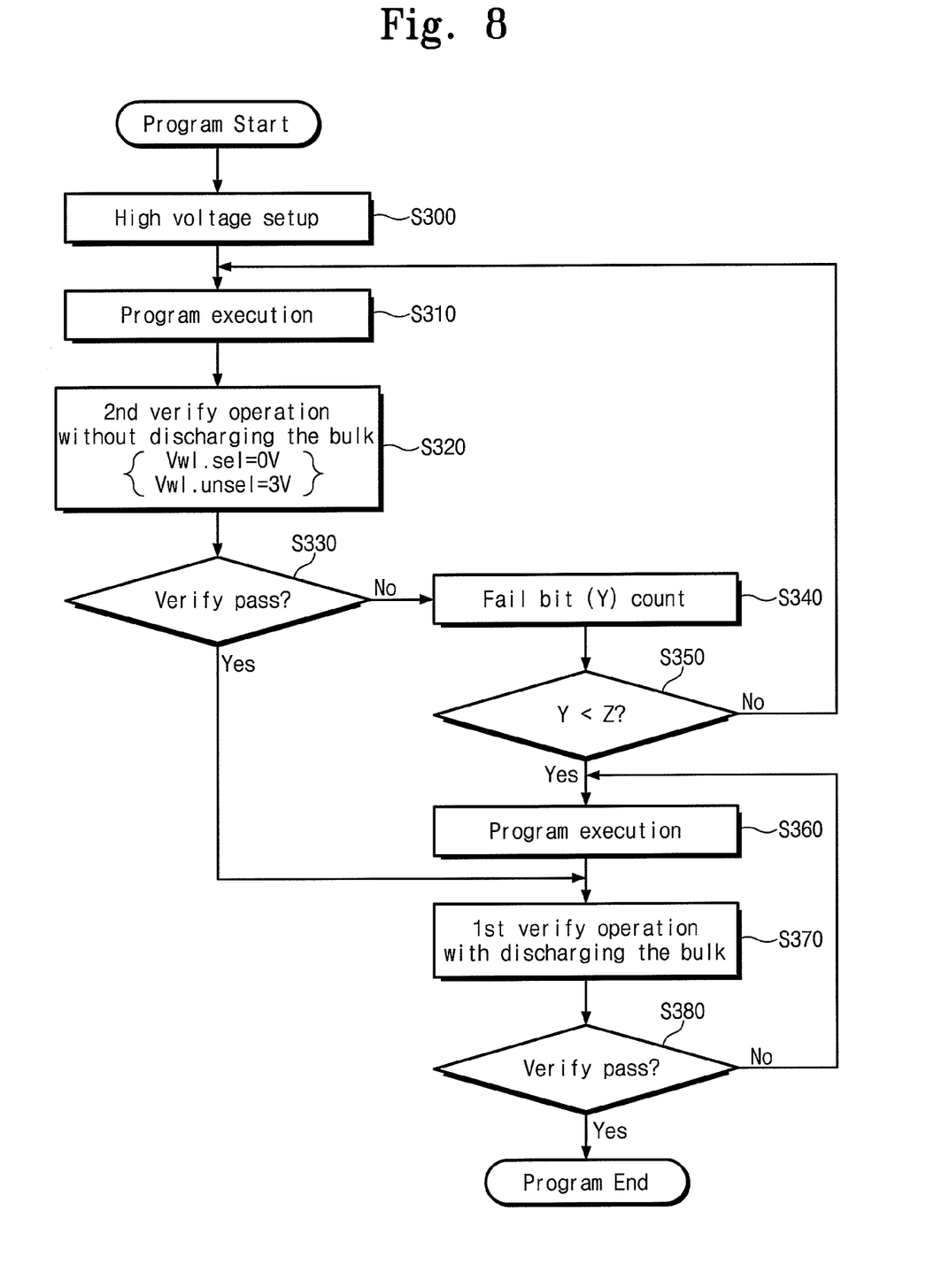
FIG. 8 is a flowchart illustrating a program operation of the embedded NAND flash memory according to an exemplary embodiment of the present invention.

FIG. 8 is a flowchart illustrating a program operation of the embedded NAND flash memory according to an exemplary embodiment of the present invention. Specifically, FIG. 8 illustrates a procedure for performing the first verify operation and the second verify operation selectively according to the number of failed bits, Referring to FIG. 3, in a program period where the number Y of detected bits with a program fail is smaller than a predetermined bit number Z, the program operation is performed according to the second verification operation. Thereafter, if the number Y of the detected fail bits is equal to or greater than the predetermined bit number Z, the program operation is performed according to the first verification operation. An example is as follows:

Upon initiation of the program operation, the program controller 130 performs a high-voltage setup operation and sets high voltages to be provided to the bulk area and the wordlines (step S300). Thereafter, the program controller 130 performs operations for program execution. For example, using the set high voltages, the program controller 130 controls the voltage regulator 140 and applies a voltage of about −6 V to the bulk area. Likewise, the program controller 130 controls the row decoder 110 and applies a voltage of about 10 V and a voltage of about 3 V respectively to the selected wordline and the unselected wordlines (step S310). Thereafter, the second verify operation is performed and a program pass/fail is verified (step S320). If there is no program fail in the selected memory cells (Yes, Step S330), the procedure proceeds to step S370 for the first verify operation. On the other hand, if the there is any program fail in the selected memory cells (No, Step S330), the program controller 130 performs bit scanning and counts the number Y of fail bits detected in the current stage (step S340). If the number Y of the detected fail bits is equal to or greater than the predetermined bit number Z (No, Step S350), the procedure returns to step S310 for a re-pro gram operation. On the other hand, if the number Y of the detected fail bits is smaller than the predetermined bit number Z (Yes, Step S350), the procedure proceeds to step S360 to program memory cells determined to be 'program fail' by the first verify operation (step S350). In the failed memory cells, a negative high voltage is provided to the bulk area, while program voltages are applied to wordlines and bitlines (step S360). Thereafter, the program controller 130 performs the first verify operation (step S370). If the result of the first verify operation is determined to be 'program fail,' (No, Step S380) the procedure returns to step S360 for a re-program operation. On the other hand, if the result of the first verify operation is determined to be 'program pass,' (Yes, Step S380) the procedure is ended.

As described above, the program operation according to an exemplary embodiment includes the first verify operation and the second verify operation. According to another exemplary embodiment, the second verify operation is performed in the former stage of the program operation, thereby making it possible to increase the program speed. In addition, the first verify operation is performed in the latter stage of the program operation, thereby making it possible to precisely control the threshold voltage distribution of the memory cells. Consequently, it is possible to increase the program, speed and to more precisely control the threshold voltage distribution.

Although the embedded NAND flash memory has been exemplified in the above description, the present invention is not limited to the embedded NAND flash memory. It should be apparent to those ski lied in the art that the present invention can be applied to all semiconductor memory devices.

As described above, the negative high voltage in the bulk area does not need to be discharged or charged repeatedly, and thus, exemplary embodiments of the present invention make it possible to realize NAND flash memory devices that can be programmed at a high speed. In addition, exemplary embodiments of the present invention can provide the high-speed program operation and the precise threshold voltage distribution, thereby making it possible to provide a high-speed and high-reliability memory device.

The above-disclosed subject matter is to be considered illustrative.

What is claimed is:

1. A method of programming a flash memory device with a plurality of memory cells, comprising:
   programming a selected memory cell under a condition where a bulk area is biased with a high voltage; and
   verifying a program pass/fail of the memory cell with the high voltage applied to the bulk area,
   wherein the high voltage is a negative high voltage,
   wherein the programming of the selected memory cell comprises applying a program voltage to a wordline connected to the selected memory cell, and
   wherein the programming of the selected memory cell further comprises creating an electric field capable of F-N tunneling between the bulk area and a control gate of the memory cell.

2. A method of programming a flash memory device with a plurality of memory cells, comprising:
   programming a selected memory cell under a condition where a bulk area is biased with a high voltage; and
   verifying a program pass/fail of the memory cell with the high voltage applied to the bulk area,
   wherein the high voltage is a negative high voltage, and
   wherein the verifying of the program pass/fail comprises applying a verify voltage and a pass voltage respectively to a wordline connected to the selected memory cell and unselected wordlines that are not connected to the selected memory cell.

3. The method of claim 2, wherein the verify voltage and the pass voltage have a voltage level for compensating a body effect that is caused due to the negative high voltage applied to the bulk area.

4. The method of claim 1, wherein the memory cells are NAND flash memory cells.

5. The method of claim 4, wherein the flash memory device is an embedded NAND flash memory device.

6. A method of programming a flash memory device with a plurality of memory cells, comprising:
   programming a selected memory cell under a condition where a bulk area is biased with high voltage; and
   verifying a program pass/fad of the memory cell with the high voltage applied to the bulk area, and further comprising:
   discharging a high voltage charged in the bulk area to a ground voltage level, after the step of programming the selected memory cell and before the step of verifying the program pass/fail of the memory cell.

7. The method of claim 2, further comprising:
discharging a high voltage charged in the bulk area to a ground voltage level, after the step of programming the selected memory cell and before the step of verifying the program pass/fail of the memory cell, and
wherein the verify voltage and the pass voltage are set with reference to the ground voltage level applied to the bulk area.

8. A method for programming a flash memory device with a plurality of memory cells, comprising:
programming and verifying selected memory cells under a condition where a bulk area is biased with a high voltage; and
programming the selected memory cells under a condition where the bulk area is biased with the high voltage and verifying a program pass/fail with the high voltage discharged from the bulk area.

9. The program method of claim 8, wherein the high voltage is a negative high voltage.

10. The program method of claim 9, wherein the programming and verifying of the selected memory cells comprises:
programming the selected memory cells under a condition where the bulk area is biased with the high voltage; and
verifying the program pass/fail of the memory cell with the high voltage applied to the bulk area.

11. The program method of claim 10, wherein the programming of the selected memory cells comprises applying a program voltage to a wordline connected to the selected memory cells.

12. The program method of claim 11, wherein the programming of the selected memory cells further comprises creating an electric field capable of F-N tunneling between the bulk area and control gates of the selected memory cells.

13. The program method of claim 11, wherein the verifying of the program pass/fail comprises applying a verify voltage and a pass voltage respectively to a wordline connected to the selected memory cells and unselected wordlines that are not connected to the selected memory cells.

14. The program method of claim 13, wherein the verify voltage and the pass voltage have a voltage level for compensating a body effect that is caused by the negative high voltage applied to the bulk area.

15. The program method of claim 10, wherein the programming and verifying of the selected memory cells comprises a program loop where the programming of the selected memory cells and the verifying of the program pass/fail are performed repeatedly.

16. The program method of claim 15, wherein the programming and verifying of the selected memory cells further comprises detecting when the number of program loops is equal to or greater than a predetermined value.

17. The program method of claim 16, wherein the programming and verifying of the selected memory cells is repeated when the number of program loops is smaller than the predetermined value.

18. The program method of claim 16, wherein the verifying of the program pass/fail is performed when the number of program loops is equal to or greater than the predetermined value.

19. The program method of claim 15, wherein the programming and verifying of the selected memory cells further comprises:
detecting the number of detected cells with the program fall; and
detecting when the number of the detected fail cells is smaller than a predetermined number.

20. The program method of claim 19, wherein the programming and verifying of the selected memory cells is repeated when the number of the detected fail cells is equal to or greater than the predetermined number.

21. The program method of claim 20, wherein the verifying of the program pass/fail is performed when the number of the detected fall cells is smaller than the predetermined number.

22. The program method of claim 9, wherein the programming of the selected memory cells comprises:
programming selected memory cells under a condition where the bulk area is biased with the negative high voltage;
discharging the negative high voltage charged in the bulk area to a ground voltage level; and
verifying a program pass/fail of the memory cell with the bulk area discharged to the ground voltage level.

23. The program method of claim 22, wherein the programming of the selected memory cells comprises applying a program voltage to a wordline connected to the selected memory cells.

24. The program method of claim 23, wherein the programming of the selected memory cells further comprises creating an electric field capable of F-N tunneling between the bulk area and a control gate of the memory cell.

25. The program method of claim 22, wherein the verifying of the program pass/fail comprises applying a verify voltage and a pass voltage respectively to a wordline connected to the selected memory cells and unselected wordlines that are not connected to the selected memory cells.

26. The program method of claim 8, wherein the memory cells are NAND flash memory cells.

27. The program method of claim 8, wherein the flash memory device is an embedded NAND flash memory device.

* * * * *